(12) United States Patent
Karlsson et al.

(10) Patent No.: US 10,933,505 B2
(45) Date of Patent: Mar. 2, 2021

(54) ARRANGEMENT TO ENCLOSE A CIRCUIT BOARD

(71) Applicant: ATLAS COPCO AIRPOWER, NAAMLOZE VENNOOTSCHAP, Wilrijk (BE)

(72) Inventors: Per-Anders Karlsson, Wilrijk (BE); Magnus Karlsson, Wilrijk (BE)

(73) Assignee: ATLAS COPCO AIRPOWER, NAAMLOZE VENNOOTSCHAP, Wilrijk (BE)

( * ) Notice: Subject to any disclaimer, the term of this patent is extended or adjusted under 35 U.S.C. 154(b) by 245 days.

(21) Appl. No.: 16/080,723

(22) PCT Filed: Feb. 21, 2017

(86) PCT No.: PCT/SE2017/050164
§ 371 (c)(1),
(2) Date: Aug. 29, 2018

(87) PCT Pub. No.: WO2017/171605
PCT Pub. Date: Oct. 5, 2017

(65) Prior Publication Data
US 2019/0015946 A1    Jan. 17, 2019

(30) Foreign Application Priority Data
Mar. 29, 2016 (SE) .................... 1650406-0

(51) Int. Cl.
*B24B 23/00* (2006.01)
*B25F 5/00* (2006.01)
(Continued)

(52) U.S. Cl.
CPC ............ *B24B 23/005* (2013.01); *B25F 5/006* (2013.01); *B25F 5/02* (2013.01); *H01L 23/24* (2013.01);
(Continued)

(58) Field of Classification Search
CPC .......... B24B 23/005; B25F 5/006; B25F 5/02; H01L 23/24; H01R 13/52; H05K 5/0056; H05K 5/0091; H05K 2203/304
See application file for complete search history.

(56) References Cited

U.S. PATENT DOCUMENTS 3,863,881 A  2/1975 Fletcher et al.
4,843,525 A  6/1989 Williams
(Continued)

FOREIGN PATENT DOCUMENTS

DE  10023226 C1  10/2001
DE  102010031631 A1  1/2012
(Continued)

OTHER PUBLICATIONS

International Search Report in related PCT Application No. PCT/SE2017/050164, dated Apr. 28, 2017.
(Continued)

*Primary Examiner* — Carl J Arbes
(74) *Attorney, Agent, or Firm* — Bacon & Thomas, PLLC

(57) ABSTRACT

An arrangement arranged to enclose a circuit board comprising electronic components is described. The arrangement comprises a structure designed to receive the circuit board and the electronic components, a housing designed to receive the structure, a cover designed to be connected to the housing, and an electric socket adapted to provide the circuit board with electricity. The electric socket is comprised in at least one of the housing or the cover. The arrangement is arranged to enclose the circuit board by the housing and the cover, wherein the structure is designed to be releasable and at least partly bear against the circuit board and the electronic components. A tool comprising an arrangement is also described.

10 Claims, 5 Drawing Sheets

(51) Int. Cl.
*B25F 5/02* (2006.01)
*H01L 23/24* (2006.01)
*H01R 13/52* (2006.01)
*H05K 5/00* (2006.01)

(52) U.S. Cl.
CPC .......... *H01R 13/52* (2013.01); *H05K 5/0091* (2013.01); *H05K 2203/304* (2013.01)

(56) References Cited

U.S. PATENT DOCUMENTS

| | | | | |
|---|---|---|---|---|
| 5,016,140 | A | * | 5/1991 | Prestel .................. H01H 1/5805 |
| | | | | 200/459 |
| 5,738,177 | A | * | 4/1998 | Schell ..................... B25B 23/14 |
| | | | | 173/178 |
| 5,913,552 | A | | 6/1999 | McLellan et al. |
| 8,212,439 | B2 | * | 7/2012 | Dautel ................ F04D 29/5813 |
| | | | | 310/62 |
| 2011/0170258 | A1 | | 7/2011 | Single et al. |
| 2015/0282337 | A1 | | 10/2015 | Ekstrom et al. |

FOREIGN PATENT DOCUMENTS

| | | |
|---|---|---|
| DE | 102013208681 A1 | 11/2014 |
| EP | 1085799 A1 | 3/2001 |
| EP | 1694103 A2 | 8/2006 |
| WO | 2004047510 A2 | 6/2004 |

OTHER PUBLICATIONS

Written Opinion in related PCT Application No. PCT/SE2017/050164, dated Apr. 28, 2017.

\* cited by examiner

ARRANGEMENT TO ENCLOSE A CIRCUIT BOARD

Present invention relates to hand-held electric tools, wherein the tools are controlled by electronic components mounted on a circuit board. Particularly, the invention relates to an arrangement arranged to enclose a circuit board comprising electronic components and to a tool comprising the arrangement.

BACKGROUND OF THE INVENTION

A hand-held tool, as for example a pick hammer, comprises an oscillating element to accomplish hits on a chisel-tool when the pick hammer is used for breaking concreate or similar. The hits create shock waves that are transported through the chisel-tool into the material to be broken. The hits cause also strong vibrations inside the pick hammer. The vibrations may cause damages of parts of the hammer. Therefore, the parts of the hammer are usually mounted with a protection for vibrations, for example in a form of rubber bushings.

Electronic components are used in an electric tool, which electronic components are mounted on a circuit board and are used to control different functions of the tool. The circuit board and the components mounted on the circuit board are exposed for strong vibrations and therefor need to be protected. Today a circuit board with electronic components is usually mounted in a casing that has been moulded of a stabilizing- and electrically-insulating material, as for example epoxy. One drawback with this solution is that the epoxy needs to be removed and later need to be remoulded in a case of reparation of the circuit board and the electronic components. This is both time consuming and difficult.

In the light of the above, there is a need of an arrangement for a circuit board comprising electronic components, for example the above mentioned casing, that facilitate reparations of the circuit board and of the electronic components.

SUMMARY OF THE INVENTION

An object of the invention is to provide an arrangement for a circuit board comprising electronic components that facilitates reparations of the circuit board and of the electronic components.

The object is achieved according to an aspect of the invention by an arrangement arranged to enclose a circuit board comprising electronic components, comprising: a structure designed to receive the circuit board and the electronic component, a housing designed to receive the structure, a cover designed to be connected to the housing, an electric socket adapted to provide the circuit board with electricity, wherein the electric socket is comprised in at least one of the housing or the cover, wherein the arrangement is arranged to enclose the circuit board by the housing and the cover. The structure is designed to, releasable and at least partly, bear against the circuit board and the electronic components.

Because the arrangement comprises the structure designed to receive the circuit board and the electronic components, the housing is designed to receive the structure and the cover is designed to be connected to the housing, the circuit board comprising the electronic components may be enclosed in a simple way by using the housing and the cover. Thereby, an arrangement is obtained that can protect the circuit board comprising the electronic components against external stress in an environment the arrangement is located.

The structure is designed to receive the circuit board and the electronic components, wherein the circuit board and the electronic components may be placed in the structure. By this, the circuit board and the electronic components are protected from, for example, vibrations. Further, because the structure is designed to, releasable and at least partly, bear against the circuit board and the electronic components, the circuit board and the electronic components may at least partly have a contact with the structure when the circuit board and the electronic components are placed in the structure. The contact between the circuit board and the electronic components with the structure admits that natural oscillations of the circuit board and/or of the electronic components are damped by the structure. Thereby, a structure is obtained that protects the circuit board and the electronic components from natural oscillations of the circuit board and the electronic components.

Further, the circuit board and the electronic components may be released from the structure, because the structure is designed to releasable and at least partly bear against the circuit board and against the electronic components. Thereby, the circuit board and the electronic components may be separated from the structure in a simple and efficient way in case of for example service or recycling.

Consequently, an arrangement for a circuit board comprising electronic components is provided, that facilitates service of the circuit board and of the electronic components mounted on the circuit board and thereby the above mentioned object is achieved.

The structure may be elastic, i.e. elastically deformable. Thereby, a flexible structure is obtained, that may adapt to different geometrical forms of the circuit board and of the electronic components.

According to some embodiments the structure comprises cavities, designed to receive the electronic components and releasable bear against the electronic components. Thereby, the electronic components may be placed in the cavities of the structure in a releasable manner which facilitates release of the electronic components from the structure. Hence, the electronic components may be released from the cavities in a simple and efficient way, which facilitates service. Further, because the electronic components may be placed in the cavities, a structure is obtained that further improves the protection against for example vibrations and that has improved damping characteristics of the electronic components.

According to some embodiments the cavities are arranged to fit tight against the electronic components by an elastic deformation of with respect to natural oscillations the cavities when receiving the electronic components. Because the cavities are arranged to fit tight against the electronic components a stabilization of the electronic components is achieved when the electronic components has been placed in the cavities. Thereby, the risk for the electronic components to end up in natural oscillations is further reduced. By the elastic deformation of the cavities when receiving the electronic components a flexible structure is obtained, that adapts to different geometrical forms of the electronic components. Thereby an arrangement is obtained that further improves the protection against for example vibrations and with further improved damping characteristics with respect to natural oscillations of the electronic components.

At least one of the cavities may be provided with elastic ribs arranged to fit tight against at least one of the electronic components when receiving the electronic components. Thereby, the elastic ribs may be in contact with at least one of the electronic components when receiving the electronic components by the cavities. The contact between the electronic components and the elastic ribs admits that natural oscillations of the electronic components may be damped in an efficient way. Thereby, a structure is obtained with improved protection against for example vibrations and with improved damping characteristics with respect to natural oscillations of the electronic components.

According to some embodiments at least one of the electronic components has a first surface facing away from the circuit board and a second surface facing against the circuit board, wherein the structure is arranged to bear against at least the first surface of the at least one of the electronic components. Thereby, the electronic components may be placed in the structure so that the structure bears against at least the first surface of the at least one of the electronic components facing away from the circuit board. In this way, a structure is obtained with a greater component contact surface against the electronic components, which further improves damping characteristics of the structure with respect to natural oscillations of the electronic components.

According to some embodiments the structure is releasable arranged in the housing. Thereby, the structure may be separated from the housing a simple and efficient way in case of for example a need of exchange of the structure. Further, this admits that different structures, arranged to receive different circuit boards may be used together with the housing.

According to some embodiments the structure is arranged to permit a tight connection between the housing and the cover, wherein the structure comprises a peripheral part, wherein the cover and the housing are arranged to achieve the tight connection by a compression of the peripheral part of the structure.

Advantageously, an arrangement is thus obtained with a tight connection between the housing and the cover, wherein a risk for undesired substance to end up inside the arrangement is reduced. A further advantage with this is that any risks for damages of the circuit board and the electronic components are reduced.

The peripheral part may comprise a radial part wherein the cover and the housing may be arranged to achieve the tight connection by a compression of the radial part. In this way the tight connection between the housing and the cover is improved because a contact surface of the structure with the housing and/or the cover is increased. An increased contact surface makes it more difficult for undesired substance to end up inside the arrangement and thereby potentially also coming in contact with the circuit board and cause damages or short-circuits on the circuit board.

According to some embodiments, the peripheral part comprises an axial part wherein the cover and the housing are arranged to achieve the tight connection by a compression of the axial part. In a similar way as with the radial part the tight connection between the housing and the cover is further improved, i.e. by increasing of a contact surface of the structure with the housing and/or the cover. As a result, again as with the radial part, the risk for undesired substance to end up inside the arrangement is reduced and thereby potentially also coming in contact with the circuit board and cause damages or short-circuits on the circuit board.

According to some embodiments the arrangement comprises the circuit board.

According to some embodiments the cover comprises at least one support element arranged to support the circuit board when the cover is mounted at the housing. Thus, the support element has a contact with the circuit board when the cover is mounted at the housing. As a result of this, the risks for the circuit board to end up in natural oscillations are reduced. Consequently, an arrangement is obtained that in a simple and efficient way counteracts natural oscillations of the circuit board.

According to a further aspect the object is achieved by a tool comprising an arrangement as described herein.

BRIEF DESCRIPTION OF THE DRAWINGS

The further aspects of the subject matter, including their particular features and advantages, will be readily understood from the following detailed description of one or several embodiments provided with reference to the accompanying drawings.

DETAILED DESCRIPTION OF THE INVENTION

The embodiments herein will now be described in more detail with reference to the accompanying drawings, in which example embodiments are shown. Disclosed features of example embodiments may be combined. Like numbers refer to like elements throughout.

Figure 1:
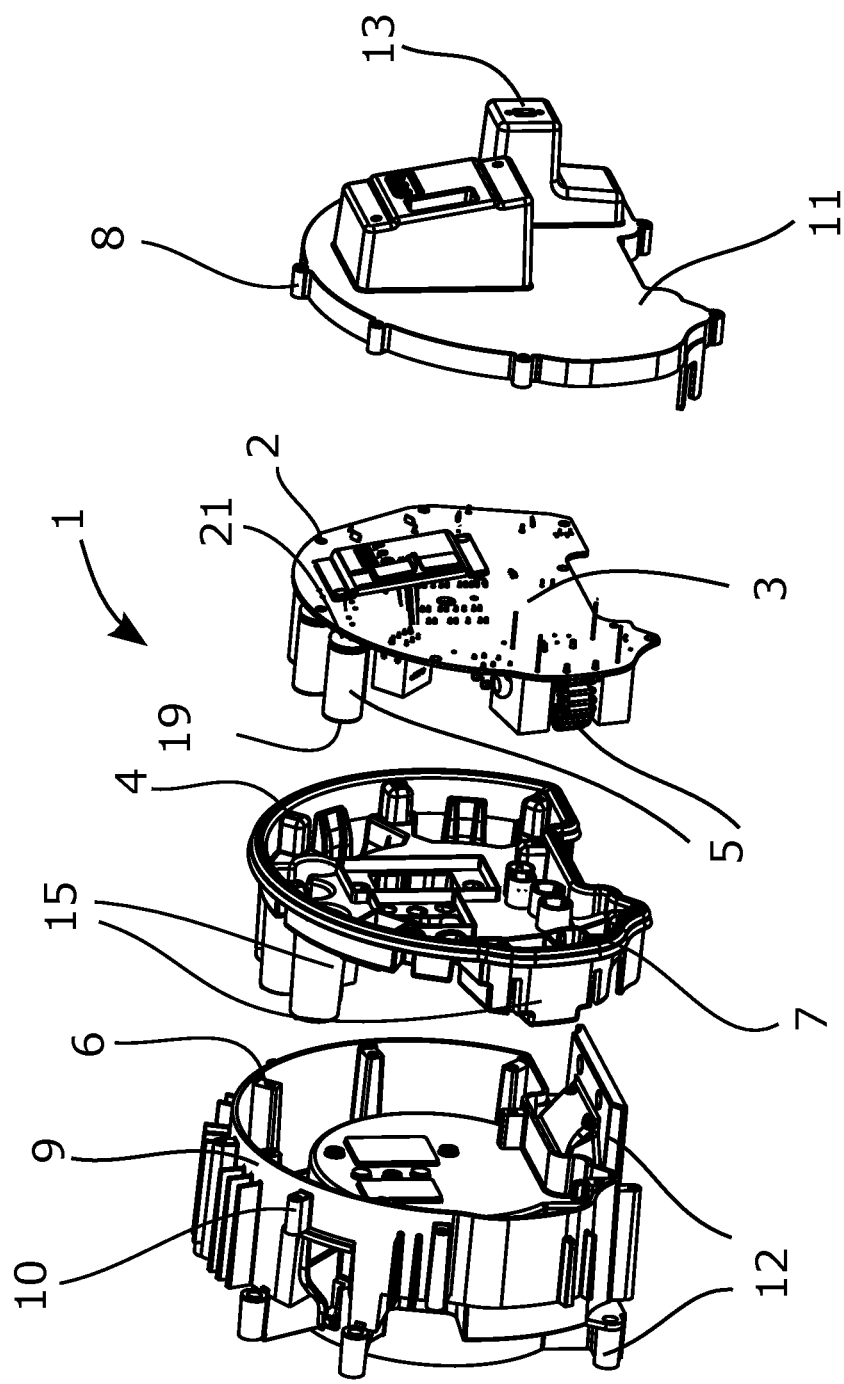
FIG. 1 shows an arrangement arranged to enclose a circuit board comprising electronic components, wherein the arrangement comprises: a structure, a housing and a cover with an electric socket separated from each other.

FIG. 1 shows an arrangement 1 arranged to enclose a circuit board 3 comprising electronic components 5. For simplicity, only a few electronic components 5 have been provided with reference. The arrangement 1 comprises a structure 7, a housing 9, a cover 11 and an electric socket 13 adapted to provide said circuit board 3 with electricity. According to FIG. 1 the structure 7, the housing 9 and the cover 11 are shown when separated from each other. It may be considered that the arrangement 1 comprise the circuit board 3 comprising the electronic components 5, but preferably it is considered, that the arrangement 1 does not comprise the circuit board 3.

As illustrated in FIG. 1, the structure has a form that corresponds to the form of the electronic components 5 arranged on the circuit board 3. The structure 7 comprises cavities 15 designed to receive the electronic components 5. For the same reasons as for the electronic components 5, only a few cavities 5 have been provided with reference. The number of the cavities 15 may be the same as the number of the electronic components 5 mounted on the circuit board 3. Each cavity 15 has a form that corresponds to the form of a corresponding electronic component 5. Thereby, the circuit board 3 and the electronic components 5 may be placed in the structure 7 in a simple and efficient way.

The structure 7 comprises a plastic material, as for example polymer, thermoplastic elastomer (TPE) or similar, with non-adhering characteristics. This makes that the structure 7 may releasable and at least partly bear against the circuit board 3 and the electronic components 5 when the circuit board 3 and the electronic components 5 have been placed in the structure 7. This admits that the circuit board 3 and the electronic components 5 may be removed from the structure 7. Thus, the structure 7 is designed to repeatable fit tight against the circuit board 3 and the electronic components 5, wherein the structure is reusable. Thus, the structure 7 may be separated from the circuit board 3 in a simple and efficient way, which advantageously may occurs in case of for example service, scrapping or recycling of the circuit board 3 and of the electronic components 5.

Further, an arrangement 1 is obtained, arranged to enclose a circuit board 3, which arrangement 1 is lighter than the known solution with molding with epoxy.

The plastic material, the structure is manufactured of, is insulating for electricity and has good damping characteristics with respect to vibrations and natural oscillations. Because the material is insulating for electricity, the electronic components 5 may be placed closer to the housing 9, than in solutions without any structure and that need to fulfill the requirements for the electricity safety standard EN 60745-1. According to such a solution an air gap of 6 mm is required between electronic components and the housing to fulfill the standard EN 60745-1. Thus, with the arrangement according to the embodiments herein, less space is required than with the solution without a structure. Thereby, the structure 7 permits shorter distance between the electronic components 5 and the housing 9. The thickness of the structure 7 may be in the range 2-4 mm, depending on which material that has been used in the structure 7.

Further, the plastic material, the structure is manufactured of, may be elastically deformable, which makes that the structure 7 may be elastic and thereby may adapt to the form of the electronic components 5 and of the circuit board 3 by an elastic deformation of the structure 7. Further, different thermal expansions of the electronic components can be handled by the structure 7 in a better way comparing with the known solution with molding with epoxy.

Because the structure 7 is designed to releasable and at least partly bear against the circuit board 3 and the electronic components 5, the circuit board 3 and the electronic components 5 may at least partly be in contact with the structure 7 when the circuit board 3 and the electronic components 5 has been placed in the structure 7.

When the circuit board 3 and the electronic components 5 has been placed in the structure 7, an elastic deformation of the structure occurs and especially of the cavities 15, which results that the cavities fit tight against the electronic components 5. The contact between the circuit board 3 and the electronic components 5 with the structure 7 results in natural oscillations of the circuit board 3 and/or of the electronic components 5 are damped by the structure.

As illustrated in FIG. 1 at least one of said electronic components 5 has a first surface 19 facing away from the circuit board 3 and a second surface 21 facing against the circuit board 3, wherein the structure 7 is arranged to bear against at least the first surface 19 of at least one of the electronic components 5. Thereby, the electronic components 5 may be placed in the structure 7, so that the structure 7 bears against at least the first surface 19 of at least one of the electronic components 5 facing away from the circuit board 3. In this way, a structure 7 is provided with a greater component contact surface against the electronic components 5, which further improves damping characteristics of the structure 3 with respect to natural oscillations of the electronic components 5.

FIG. 1 shows that the housing 9 has a form that essentially corresponds to the form of the structure 7 so the structure may fit the housing 9 when the structure 7 has been placed in the housing 9. The structure 7 is releasable arranged in the housing 9. Thereby, the structure 7 may be placed in the housing 9 and separated from the housing 9 in a simple and efficient way in case of service or when a change of the structure 7 is needed if the structure has broken. Further, different structures with forms that substantially correspond to the form of the structure 7 but that may differ from the structure 7 in details may be placed in the housing 9. This permits also that the circuit board 3 may comprise different electronic components 5 that may be placed in the structure 7. The housing 9 may be manufactured by aluminium, magnesium, plastic, polyamide or similar.

According to the embodiment illustrated in FIG. 1, the electric socket 13 is comprised in the cover 11. In other embodiments the electric socket 13 may be comprised in the housing 9.

The arrangement 1 is arranged to enclose the circuit board 3 by the housing 9 and by the cover 11. The form of the cover 11 corresponds substantially to the form of the circuit board 3. When the circuit board 3 comprising the electronic components 5 is intended to be mounted in the arrangement 1, first the circuit board 3 and the electronic components 5 may be placed in the structure 7 and later the circuit board 3 together with the structure are placed in the housing 9. Assembly of the arrangement is also possible in different order. For example, first the structure 7 may be placed in the housing 9 and after that the circuit board 3 and the electronic components 5 may be placed in the structure 7.

The circuit board 3 may be screwed into the housing 9 by screws (not shown) that are inserted in board apertures 2 in the circuit board 3, further through structure apertures 4 in the structure 7 and at the end to be screwed tight into fastenings 6 of the housing 9. For simplicity, only one board aperture 2, one structure aperture 4 and one fastening 6 respectively have been provided with reference in FIG. 1.

After the circuit board 3 has been screwed tight into the housing 9, the cover 11 is mounted at the housing 9 for example by additional screws (shown in FIG. 2) that are inserted through cover apertures 8 in the cover 11 and that are screwed tight into additional fastenings 10 in the housing 9. For the same reason as above only one cover aperture 8 and only one additional fastening 10 respectively have been provided with reference. The cover 11 may be fastened in the housing 9 using for example clamps in combination with additional screws or instead of them.

The cover 11 may preferably be manufactured of plastic as polyamide, or of the same type of material as housing 9.

Further, as illustrated in FIG. 1, the housing 9 comprises a mounting element 12 for mounting of the housing 9 at a frame (not shown) as a framework in a tool.

Figure 2:
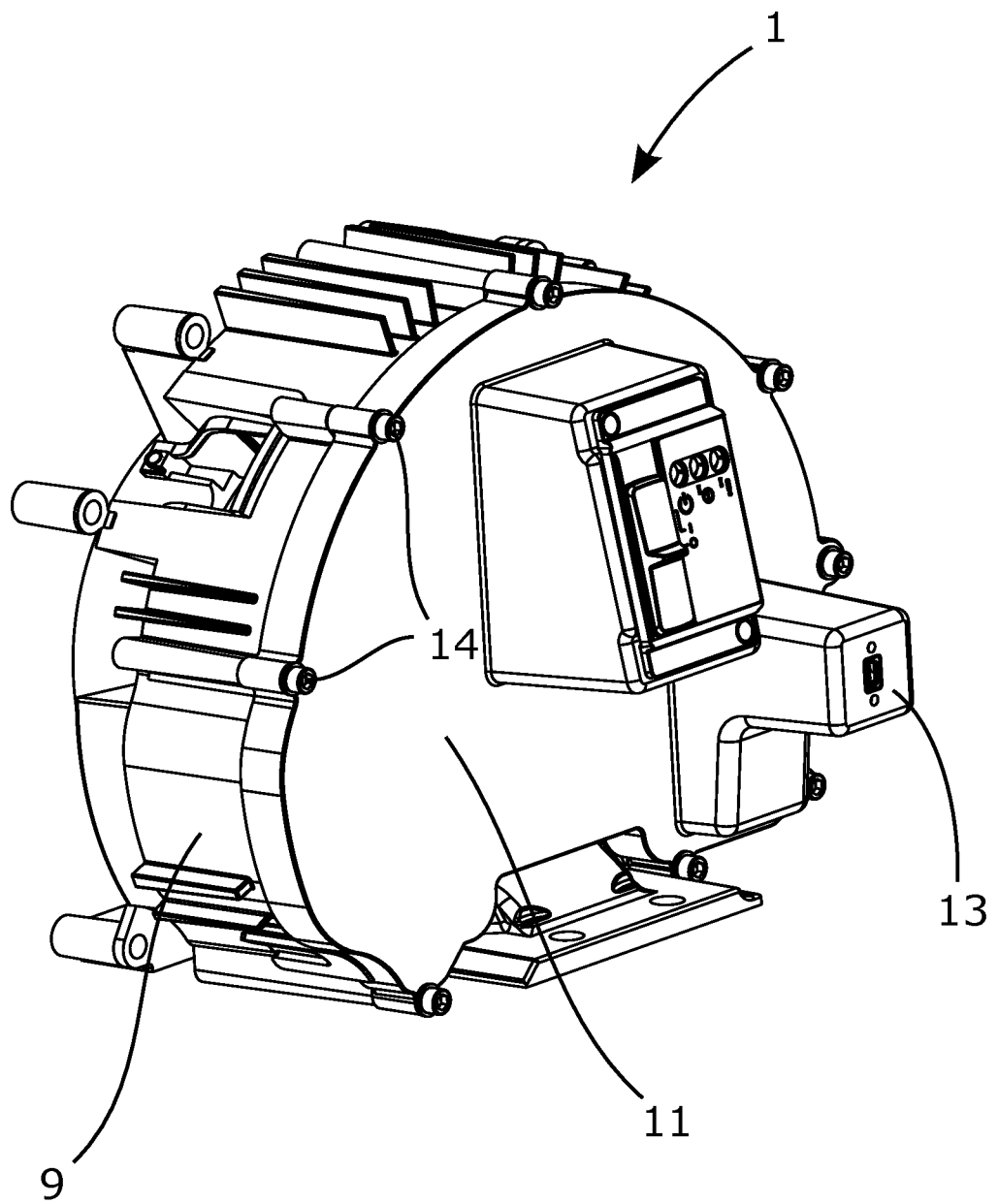
FIG. 2 shows the arrangement illustrated in FIG. 1, wherein the arrangement is assembled.

FIG. 2 shows the arrangement 1 illustrated in FIG. 1. According to FIG. 2 the arrangement 1 has been assembled by screwing the cover 11 and the housing 9 together by the earlier mentioned additional screws 14 (only the head of the additional screws 14 are shown in the figure). For simplicity, only a few of the additional screws 14 have been provided with reference.

As illustrated in FIG. 2, the cover 11 has been screwed tight into the housing 9 and thereby the circuit board 3 comprising the electronic components has been enclosed in the arrangement 1 by the housing 9 and the cover 11. In this way, the arrangement 1 protects the circuit board comprising the electronic components against external stress from an environment the arrangement 1 is placed in, as vibrations, high temperatures, dust, liquids or similar.

Figure 3:
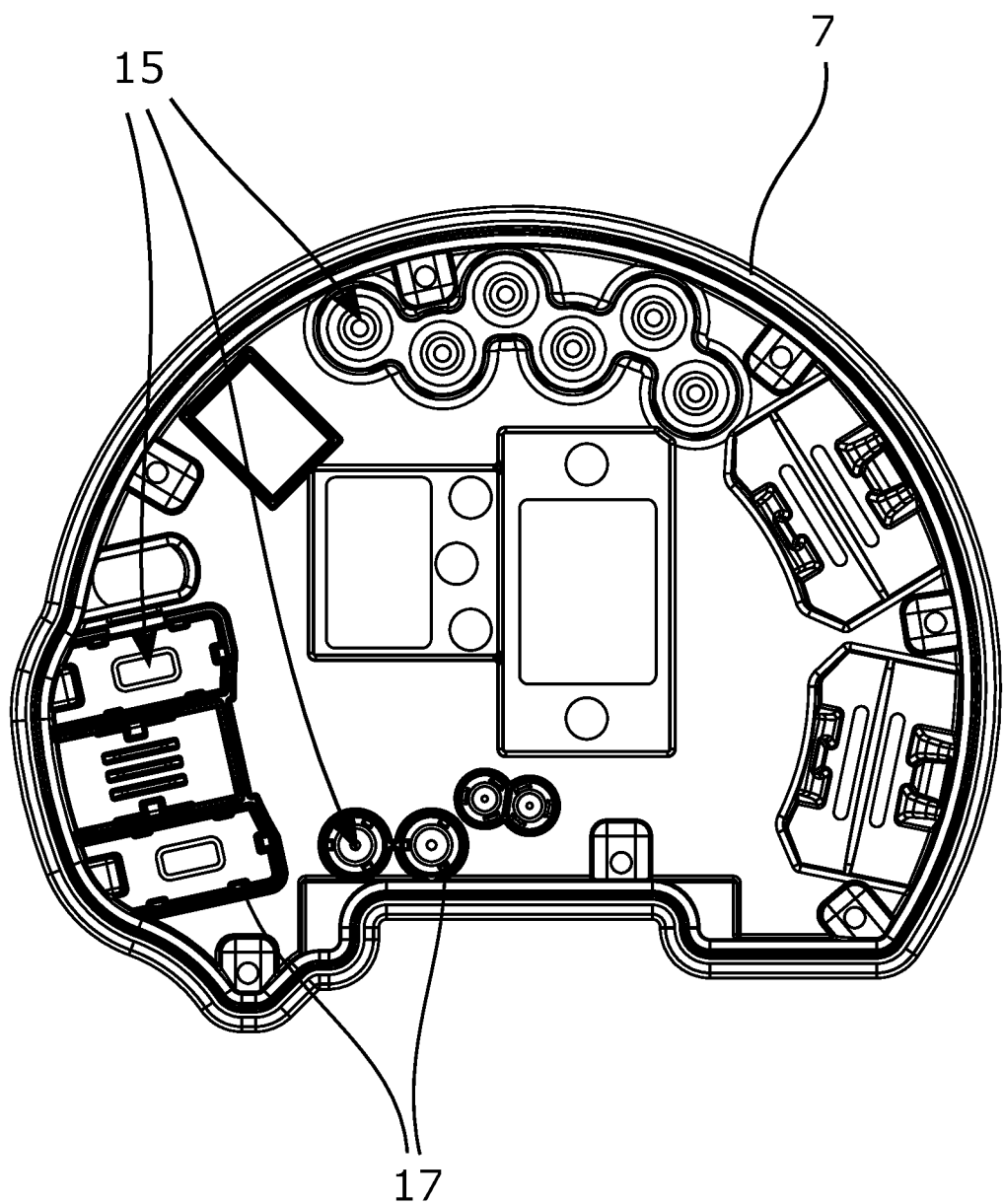
FIG. 3 shows the structure in FIG. 1.

FIG. 3 shows the structure according to FIG. 1. The structure 7 comprises cavities 15, which in number may the same as the electronic components 5 mounted at the circuit board 3 as illustrated in FIG. 1, but the number of the cavities 15 may be more or less than the number of the electronic components. Sometimes the circuit board comprises one or several flat electronic components, i.e. these electronic components do not protrude significantly from the surface of the circuit board. When the circuit board comprises these flat electronic components, the number of the cavities may be less than the number of the electronic components. If the number of the cavities 15 is higher than the number of the electronic components, the structure may possibly by used together with different circuit boards. For simplicity, only a few of the cavities 15 have been provided with reference in FIG. 3. Each cavity 15 has a form corresponding to the form of a corresponding electronic component. Thereby, the circuit board and the electronic components may be placed in the structure 7 in a simple and efficient way.

As illustrated in FIG. 3, at least one of the cavities 15 is provided with elastic ribs 17. For simplicity, only a few ribs 17 have been provided with reference. The elastic ribs 17 may be manufactured of the same material as the structure 7. Thus, the ribs 17 are elastically deformable and are arranged to fit tight against at least one of the electronic components when the circuit board has been placed in the structure 7. This occurs by said elastic deformation of the ribs 17 when the electronic components are placed in the cavity or in the cavities 15 provided with the ribs 17. Thereby, the elastic ribs 17 can come in contact with at least one of the electronic components when said the cavity or the cavities 15 receiving the electronic components. The contact between the electronic components and the elastic ribs 17 admits that natural oscillations of the electronic components may be damped in an efficient way. Thereby, a structure 7 is obtained with improved protection against for example vibrations and with improved damping characteristic with respect to natural oscillations of the electronic components.

Figure 4:
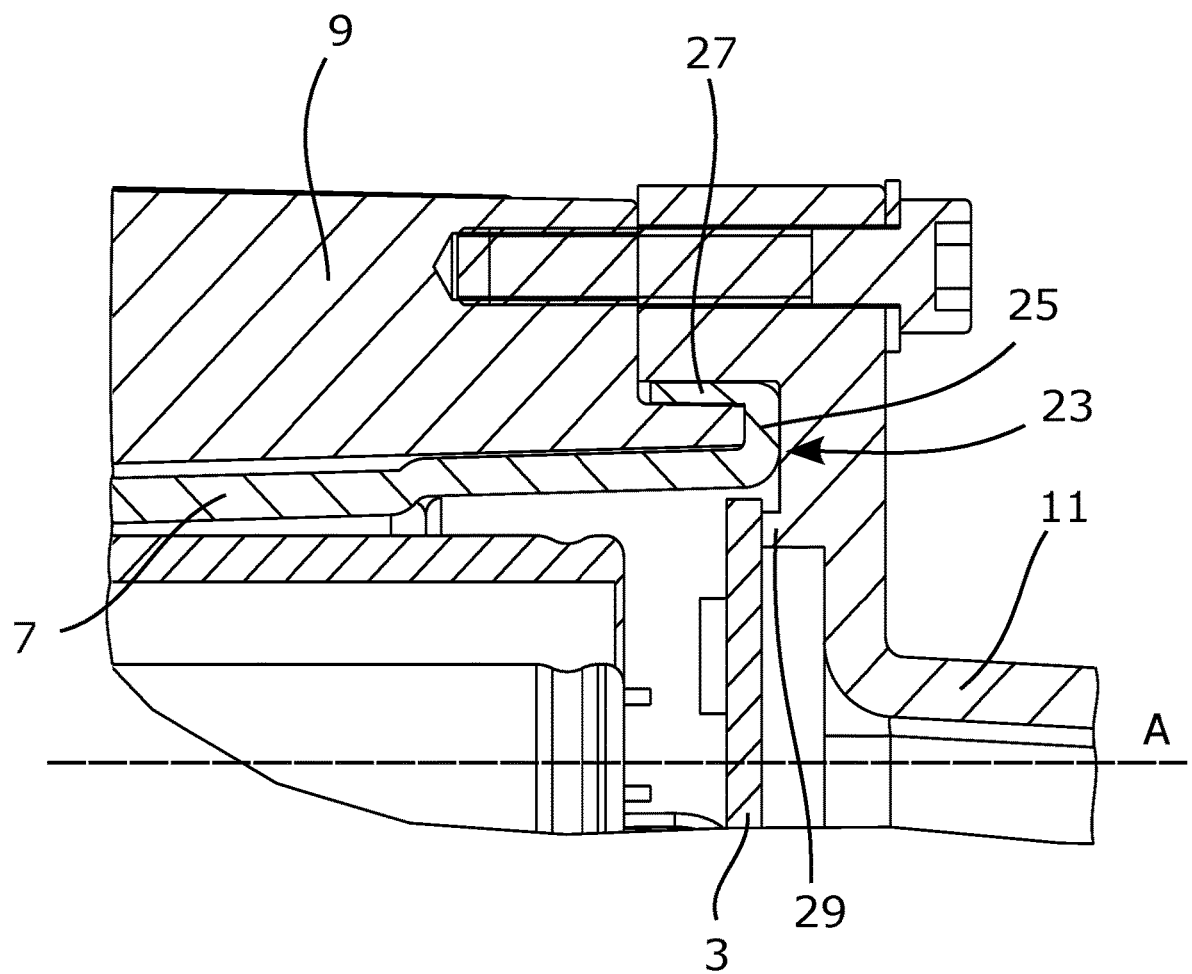
FIG. 4 shows a peripheral part of the structure shown in FIG. 1 and FIG. 3.

FIG. 4 shows a peripheral part 23 of the structure 7. The peripheral part 23 may preferably be of the same material as the rest of the structure 7. The peripheral part 23 comprises a radial part 25. The radial part 25 protrudes radially in relation to an axis A through the structure 7. The axis A is substantially perpendicular in relation to a main extension plane (not shown) of the structure 7. As illustrated in FIG. 4, the peripheral part 23 comprises also an axial part 27. The axial part 27 protrudes axially from the radial part 25, i.e. substantially parallel with the axis A. According to the embodiment shown in FIG. 4, the axial part 27 is arranged in connection to an outer end of the radial part 25 seen in relation to the axis A.

As illustrated in FIG. 4, the housing 9 and the cover 11 are adapted to receive the radial part 25 and the axial part 27 by that the housing 9 and the cover 11 are shaped so that a channel is formed between the housing 9 and the cover 11 when the cover 11 has been screwed to the housing 9, wherein the channel according to the embodiment in FIG. 4. Has a form of a mirror-inverted "C". Thereby, the radial part 25 and the axial part 27 may be placed between the housing 9 and the cover 11 without risks that the radial part 25 and/or the axial part 27 breaks. The housing 9 and the cover 11 are formed so that the distance between the housing 9 and the cover 11 along said channel is less than the thickness of the radial part 25 and the axial part 27. In this way the cover 11 and the housing 9 are arranged to achieve a tight connection between the cover 11 and the housing 9 by compression of the radial part 25 and/or of the axial part 27 when the cover 11 is mounted at the housing 9.

The radial part 25 and the axial part 27 of the peripheral part 23 of the structure 7 result in increased contact surface of the structure 7 with the housing 9 and/or the cover 11, which improves the tight connection between the housing 9 and the cover 11. Thereby, a tight connection between the housing 9 and the cover 11 is achieved, which makes it more difficult for undesired substance to end up inside the arrangement and thereby potentially also coming in contact with the circuit board 3 and the electronic components and cause damages or short-circuits on the circuit board 3 and the electronic components.

As illustrated in FIG. 4, the cover 11 comprises a support element 29 arranged to support the circuit board 3 when the cover 11 is mounted at the housing 9. According to the embodiment illustrated in FIG. 4, the support element 29 is formed as a part of the cover 11, wherein the support element 29 may be manufactured of the same material as the cover 11. According to other embodiments, the support element 29 may be arranged as a separate part that may be of different material as the cover 11. In such an embodiment support element 29 is mounted at the cover 11 by for example a screw. Thus, the support element 29 has a contact with the circuit board 3 when the cover 11 is mounted at the housing 9. As a result of this, the risks for the circuit board 3 to end up in natural oscillations are reduced. Consequently, an arrangement is obtained that in a simple and efficient way counteracts natural oscillations of the circuit board 3.

Figure 5:
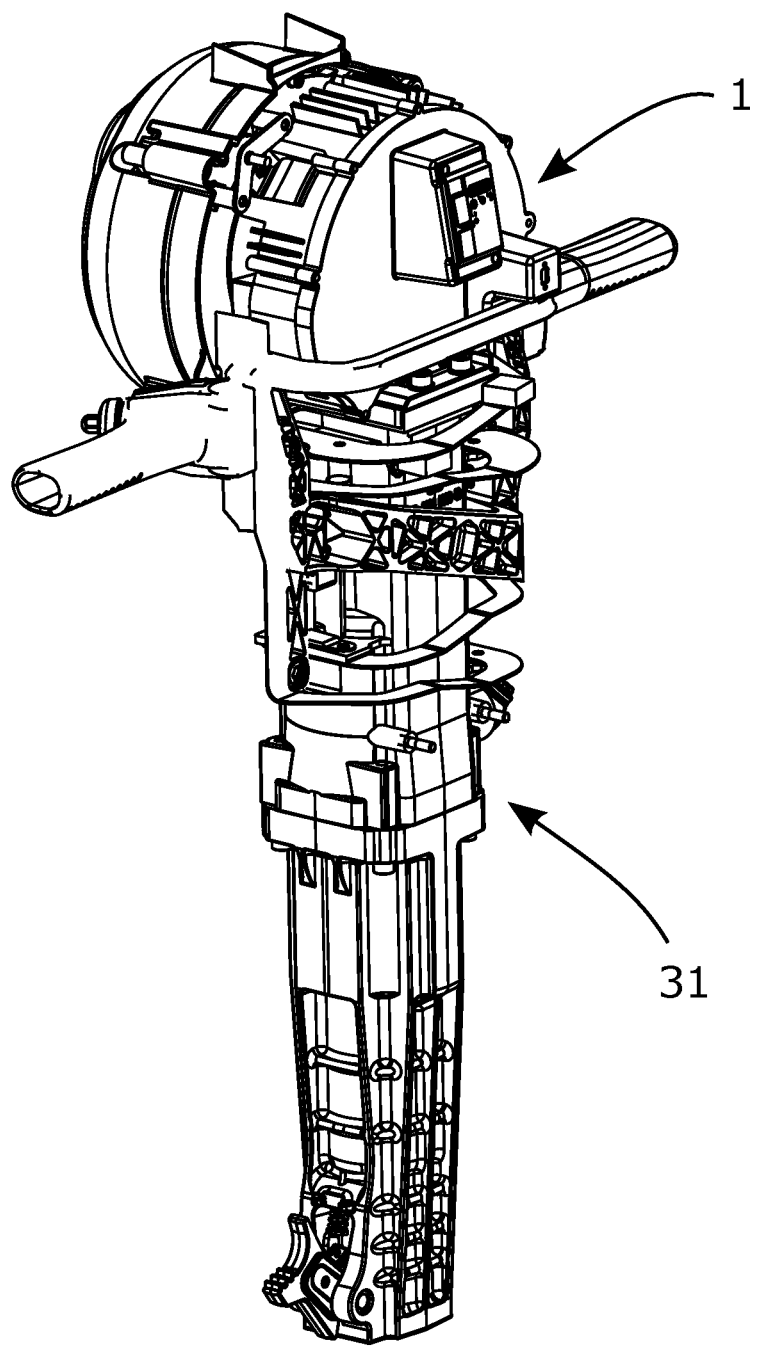
FIG. 5 shows a tool comprising the arrangement shown in FIG. 1 and FIG. 2.

FIG. 5 shows a tool 31 comprising an arrangement 1 according to the embodiments as described herein. The tool 31 may as for example be a pick hammer, a percussion drilling machine, a chainsaw, a wall saw etc. The tool 31 is illustrated in a stripped form without protection covers that may be mounted at a framework of the tool 31.

The invention claimed is:

1. An arrangement arranged to enclose a circuit board comprising:
    the circuit board, said circuit board comprising electronic components that protrude from a surface of the circuit board,
    a structure that corresponds to the electronic components for receiving said circuit board and said electronic components,
    a housing that receives said structure,
    a cover that is connectable to said housing,
    an electric socket to provide said circuit board with electricity, wherein said electric socket is provided in at least one of said housing or said cover,
    wherein said arrangement encloses said circuit board by said housing and said cover, and
    wherein said structure is releasable and at least bears against said circuit board and against said electronic components,
    wherein said structure comprises cavities, said cavities receiving said electronic components.

2. The arrangement according to claim 1, wherein said structure is elastic.

3. The arrangement according to claim 1, wherein said structure comprising said cavities fits tightly against said electronic components by an elastic deformation of said structure forming the cavities when receiving said electronic components.

4. The arrangement according to claim 1, wherein at least one of said cavities is provided with elastic ribs to fit tightly against at least one of said electronic components when receiving said electronic components.

5. The arrangement according to claim 1, wherein at least one of said electronic components has a first surface facing away from said circuit board and a second surface facing against said circuit board, wherein said structure bears against at least said first surface of said at least one of the electronic components.

6. The arrangement according to claim 1, wherein said structure provides a tight connection between said housing and said cover, wherein said structure comprises a peripheral part, said peripheral part comprising at least a radial part that protrudes radially in relation to an axis through the structure, wherein said cover and said housing have said tight connection by a compression of at least said radial part.

7. The arrangement according to claim 6, wherein said peripheral part further comprises an axial part that protrudes axially in relation to the axis through the structure, wherein said cover and said housing have said tight connection by a compression of said axial part.

8. The arrangement according to claim 1, wherein said cover comprises at least one support element arranged to support said circuit board when said cover is mounted at said housing.

9. A tool comprising an arrangement according to claim 1.

10. The tool according to claim 9, said tool comprising an oscillating element.

\* \* \* \* \*